United States Patent
Shi (10) Patent No.: US 12,312,237 B2
(45) Date of Patent: May 27, 2025

(54) MEMS SWITCH AND MANUFACTURE METHOD

(71) Applicants: Beijing BOE Technology Development Co., Ltd., Beijing (CN); BOE Technology Group Co., Ltd., Beijing (CN)

(72) Inventor: Yingli Shi, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/777,427

(22) PCT Filed: Jun. 3, 2021

(86) PCT No.: PCT/CN2021/098111
§ 371 (c)(1),
(2) Date: May 17, 2022

(87) PCT Pub. No.: WO2022/252177
PCT Pub. Date: Dec. 8, 2022

(65) Prior Publication Data
US 2024/0166496 A1    May 23, 2024

(51) Int. Cl.
*H01H 59/00* (2006.01)
*B81B 7/00* (2006.01)

(52) U.S. Cl.
CPC ...... *B81B 7/0054* (2013.01); *B81B 2201/018* (2013.01); *B81B 2203/0109* (2013.01); *H01H 59/0009* (2013.01)

(58) Field of Classification Search
CPC .. H01H 59/0009; H01H 1/0036; H01H 57/00; H01H 50/005; H01H 2057/006; H01H 2059/0072; H01H 2001/0078; H01H 2001/0084; H01H 1/0094; H01H 1/20; B81B 7/0054; B81B 2201/018; B81B 2203/0109; B81B 7/0048; B81B 2201/016; H01P 1/15
See application file for complete search history.

(56) References Cited

U.S. PATENT DOCUMENTS

2014/0011697 A1    1/2014   Vasan et al.
2017/0088416 A1*   3/2017   Tocchio .................. H01L 23/13

FOREIGN PATENT DOCUMENTS

| CN | 106441646 A | 2/2017 |
| CN | 106563974 A | 4/2017 |
| CN | 106672894 A | 5/2017 |
| CN | 107416760 A | 12/2017 |
| CN | 110723713 A | 1/2020 |
| CN | 110745772 A | 2/2020 |
| CN | 112225168 A | 1/2021 |

* cited by examiner

*Primary Examiner* — Ahmed M Saeed
(74) *Attorney, Agent, or Firm* — IPro, PLLC (57) ABSTRACT

The present disclosure provides a flexible MEMS switch, including an MEMS body and a packaging body outside the MEMS body, the packaging body includes a first flexible cover plate and a second flexible cover plate arranged at two opposite sides of the MEMS body respectively, a first cavity is formed between the first flexible cover plate and the MEMS body, and a second cavity is formed between the second flexible cover plate and the MEMS body. The present disclosure further provides a method for manufacturing the flexible MEMS switch.

12 Claims, 7 Drawing Sheets

MEMS SWITCH AND MANUFACTURE METHOD

CROSS-REFERENCE TO RELATED APPLICATION

This application is the U.S. national phase of PCT Application No. PCT/CN2021/098111 filed on Jun. 3, 2021, which is incorporated herein by reference in its entirety.

TECHNICAL FIELD

The present disclosure relates to a Micro-Electro-Mechanical System (MEMS) device, in particular to an MEMS switch and a manufacturing method thereof.

BACKGROUND

There are various MEMS switches, e.g., a membrane/bridge structure such as a cantilever beam or a simply-supported beam. The MEMS switch generally includes a substrate, two grounded lines on the substrate, a signal transmission line between the two grounded lines, and an electrode arranged on the signal transmission line. Two ends of the electrode are coupled to the two grounded lines respectively. When a flexible MEMS switch is deformed as a whole, the substrate is deformed too, and a distance between the electrode and the signal transmission line is changed, so the performance of the flexible MEMS switch will be adversely affected.

SUMMARY

An object of the present disclosure is to provide an MEMS switch and a manufacturing method thereof, so as to prevent the performance of the flexible MEMS switch from being adversely affected when the flexible MEMS switch is deformed.

In one aspect, the present disclosure provides in some embodiments a flexible MEMS switch, including an MEMS body and a packaging body outside the MEMS body. The packaging body includes a first flexible cover plate and a second flexible cover plate, the first flexible cover plate and the second flexible cover plate are arranged at opposite sides of the MEMS body respectively, a first cavity is formed between the first flexible cover plate and the MEMS body, and a second cavity is formed between the second flexible cover plate and the MEMS body.

In a possible embodiment of the present disclosure, the MEMS body is located at a neutral layer of the packaging body.

In a possible embodiment of the present disclosure, the MEMS body includes a flexible base substrate and a functional element on the flexible base substrate, the flexible base substrate includes a first portion where the functional element is arranged and a second portion surrounding the first portion, the second portion is of an annular shape and coupled to the packaging body, the first portion includes a plurality of side walls facing the second portion, the plurality of side walls includes at least a first side wall, and a part of the first side wall in an extension direction of the first side wall is depressed in a direction away from the second portion to form a gap between the first side wall and the second portion.

In a possible embodiment of the present disclosure, the plurality of side walls includes the first side wall and a second side wall arranged symmetrically opposite to the first side wall.

In a possible embodiment of the present disclosure, the MEMS body includes a flexible base substrate and a functional element on the flexible base substrate, the flexible base substrate includes a first portion where the functional element is arranged and a second portion surrounding the first portion, the second portion is of an annular shape and coupled to the packaging body, the first portion includes a plurality of side walls facing the second portion, the plurality of side walls includes a first side wall and a second side wall arranged opposite to the first side wall, a gap is formed between the first side wall and the second portion, and a gap is formed between the second side wall and the second portion.

In a possible embodiment of the present disclosure, the plurality of side walls includes the first side wall, the second side wall arranged opposite to the first side wall, a third side wall and a fourth side wall arranged symmetrically opposite to the third side wall, and a part of the first side wall in an extension direction of the first side wall is depressed in a direction away from the second portion to form a notch.

In a possible embodiment of the present disclosure, the functional element includes a first electrode, a second electrode and a third electrode arranged side-by-side and spaced apart from each other on the first portion, the second electrode is a signal transmission line, both the first electrode and the third electrode are grounded lines, the MEMS body further includes a fourth electrode arranged at a side of the second electrode away from the flexible base substrate, and two ends of the fourth electrode are coupled to the first electrode and the third electrode respectively.

In a possible embodiment of the present disclosure, an insulation layer is arranged at a side of the second electrode away from the flexible base substrate.

In another aspect, the present disclosure provides in some embodiments a method for manufacturing the above-mentioned MEMS switch, including forming an MEMS body, a first flexible cover plate and a second flexible cover plate, and enabling the first flexible cover plate and the second flexible cover plate to be coupled to the MEMS body at two opposite sides respectively.

In a possible embodiment of the present disclosure, the forming the MEMS body includes: forming a flexible substrate on a rigid substrate; depositing metal on the flexible substrate to form a first electrode, a second electrode and a third electrode arranged side-by-side and spaced apart from each other; forming an insulation layer on the second electrode; forming a sacrificial layer on the insulation layer; forming a fourth electrode on the sacrificial layer, two ends of the fourth electrode being coupled to the first electrode and the third electrode respectively; and removing the sacrificial layer.

In a possible embodiment of the present disclosure, the first flexible cover plate is formed through a same process as the second flexible cover plate, and the forming the first flexible cover plate includes coating a flexible material on the rigid substrate and forming the first flexible cover plate through a photolithography process.

In a possible embodiment of the present disclosure, the MEMS body includes a flexible base substrate and a functional element on the flexible base substrate, and the flexible base substrate includes a first portion where the functional element is arranged and a second portion surrounding the first portion. The enabling the first flexible cover plate and the second flexible cover plate to be coupled to the MEMS body at two opposite sides respectively includes: fastening the rigid substrate with the first flexible cover plate onto a first side of the MEMS body, and enabling an end surface of a side wall of the first flexible cover plate to be coupled to the second portion of the flexible base substrate; removing the rigid substrate coupled to the MEMS body through a laser lift-off process; fastening the rigid substrate with the second flexible cover plate onto a second side of the MEMS body opposite to the first side, and enabling an end surface of a side wall of the second flexible cover plate to be coupled to the second portion of the flexible base substrate; and removing the rigid substrate coupled to the first flexible cover plate and the rigid substrate coupled to the second flexible cover plate through a laser lift-off process.

The present disclosure has the following beneficial effects. The MEMS body is suspended in the packaging body, so as to reduce a stress applied to the MEMS body when the whole flexible MEMS switch is deformed, and reduce a deformation amount of the MEMS body, thereby to prevent the performance of the flexible MEMS switch from being adversely affected when the flexible MEMS switch is deformed.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be appreciated that, such words as "in the middle of", "on/above", "under/below", "left", "right", "vertical", "horizontal", "inside" and "outside" may be used to indicate directions or positions as viewed in the drawings, and they are merely used to facilitate the description in the present disclosure, rather than to indicate or imply that a device or member must be arranged or operated at a specific position. In addition, such words as "first", "second" and "third" may be merely used to differentiate different components rather than to indicate or imply any importance.

Figure 1:
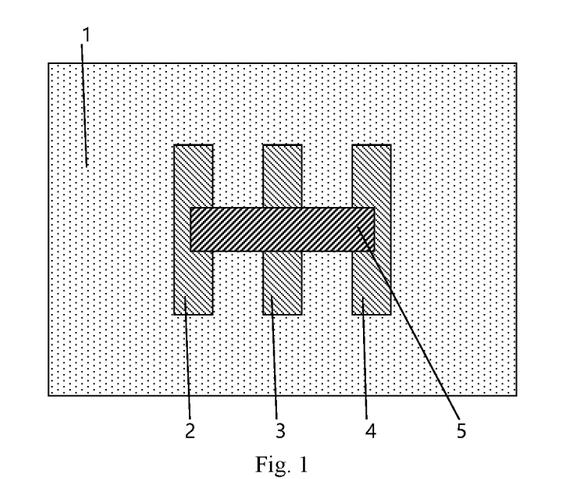
FIG. 1 is a schematic view showing a conventional MEMS switch.
Figure 2:
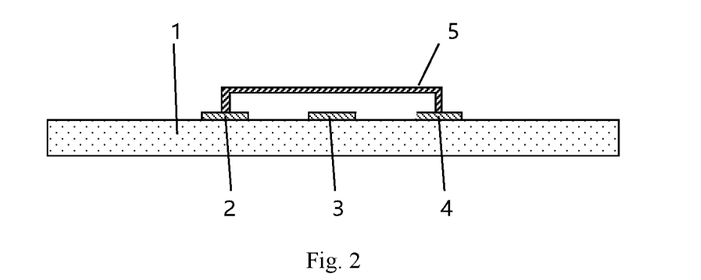
FIG. 2 is another schematic view showing the conventional MEMS switch.
Figure 3:
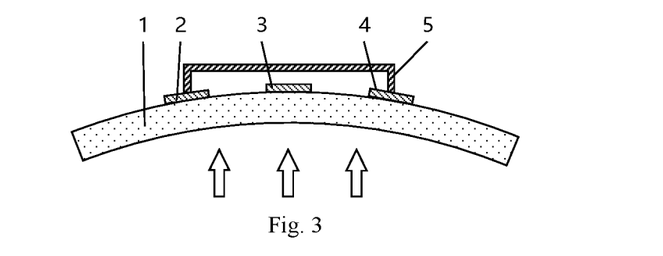
FIG. 3 is a schematic view showing a bending state of the conventional MEMS switch.

As shown in FIG. 1 to FIG. 3, a conventional MEMS switch generally includes a flexible substrate 1, a first electrode 2, a second electrode 3 and a third electrode 4 arranged on the flexible substrate 1, and a fourth electrode 5 arranged on the second electrode 3. Two ends of the fourth electrode 5 are coupled to the first electrode 2 and the third electrode 4 respectively, the first electrode 2 and the third electrode 4 are grounded lines, and the second electrode 3 is a signal transmission line. A working principle of the conventional MEMS switch will be described as follows. A Direct Current (DC) bias voltage is applied to the second electrode 3 and the fourth electrode 5, and a distance between the second electrode 3 and the fourth electrode 5 is changed under the effect of an electrostatic force, so as to change a capacitance between the second electrode 3 and the fourth electrode 5, thereby to allow or prohibit the transmission of a Radio Frequency (RF) signal. In use, the DC bias voltage is applied to the second electrode 3 and the fourth electrode 5, and the static force generated by the bias voltage on the second electrode 3 and the fourth electrode 5 will enable the fourth electrode 5 to be bent downwardly and finally in contact with a dielectric layer on the second electrode 3. Due to a large initial distance between the second electrode 3 and the fourth electrode 5, the capacitance is very small, and the RF signal will be transmitted along a signal line. However, as the distance between the second electrode 3 and the fourth electrode 5 decreases, the capacitance may increase, and the RF signal will be coupled to the grounded line through a gold film to turn on the switch. On the contrary, when the bias voltage is not applied, the fourth electrode 5 returns to its initial position due to its own elasticity, the distance between the second electrode 3 and the fourth electrode 5 increases, and the capacitance decreases, so the RF signal may not be coupled to the grounded line but continue to be transmitted along the signal line to turn off the switch.

When the whole flexible MEMS switch is deformed, the flexible substrate is deformed too, so the distance between the second electrode and the fourth electrode is changed, and the performance of the flexible MEMS switch may be adversely affected. FIG. 3 shows a bending state of the whole flexible MEMS switch.

In view of the above problems, the present disclosure provides in some embodiments a flexible MEMS switch, including an MEMS body and a packaging body 1 outside the MEMS body. The packaging body 1 includes a first flexible cover plate 40 and a second flexible cover plate 60 arranged at two opposite sides of the MEMS body respectively, a first cavity 11 is formed between the first flexible cover plate 40 and the MEMS body, and a second cavity 12 is formed between the second flexible cover plate 60 and the MEMS body.

When the first cavity 11 is formed between the first flexible cover plate 40 and the MEMS body and the second cavity 12 is formed between the second flexible cover plate 60 and the MEMS body, the MEMS body is suspended in the packaging body 1. Through the first cavity 11 and the second cavity 12, it is able to reduce a stress applied to the MEMS body when the whole flexible MEMS switch is deformed, reduce a deformation amount of the MEMS body, and prevent the MEMS body from being adversely affected by the deformation of the whole flexible MEMS switch, thereby to prevent the performance of the flexible MEMS switch from being adversely affected when the flexible MEMS switch is deformed.

Figure 11:
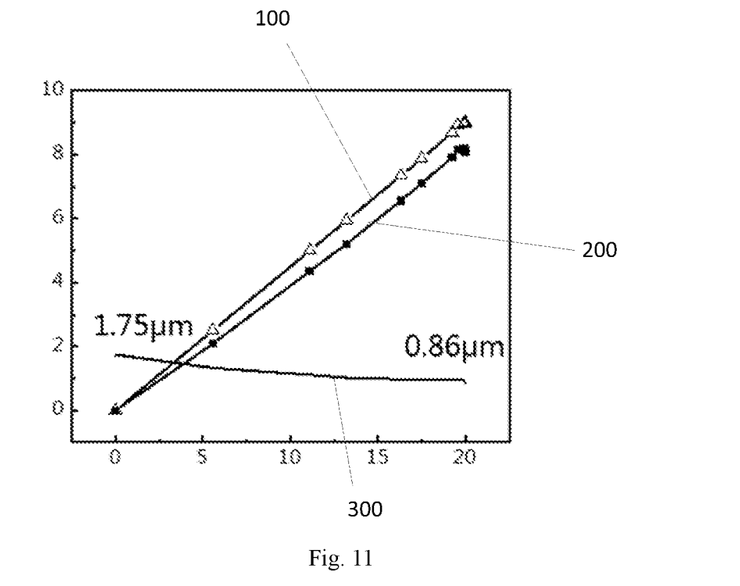
FIG. 11 is a curve diagram showing a change in a distance between a second electrode and a fourth electrode when the conventional MEMS switch is bent.
Figure 12:
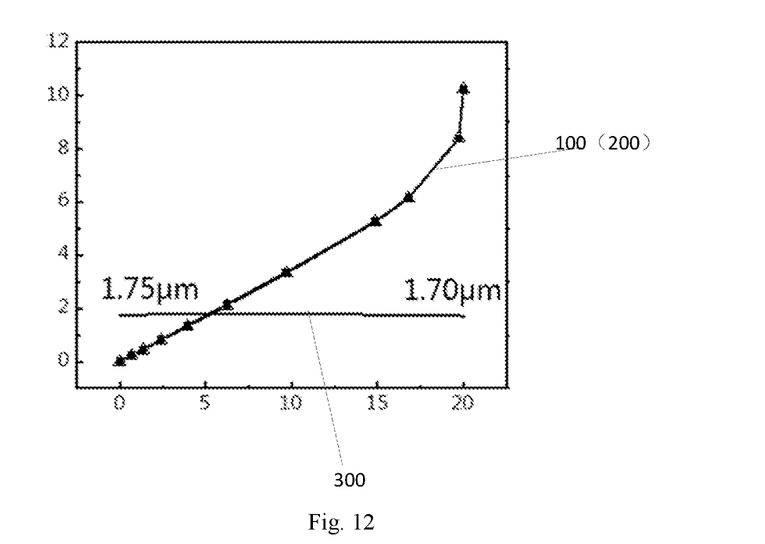
FIG. 12 is a curve diagram showing a change in a distance between a second electrode and a fourth electrode when the flexible MEMS switch is bent according to one embodiment of the present disclosure.

FIG. 11 shows a change in a distance between the second electrode and the fourth electrode when the MEMS switch is bent in the related art, and FIG. 12 shows a change in a distance between the second electrode and the fourth electrode when the flexible MEMS switch is bent in the embodiments of the present disclosure, where an abscissa is curvature, an ordinate is displacement, 100 represents the displacement of the second electrode 3, 200 represents the displacement of the fourth electrode 5, and 300 represents the distance between the second electrode 3 and the fourth electrode 5.

Figure 10:
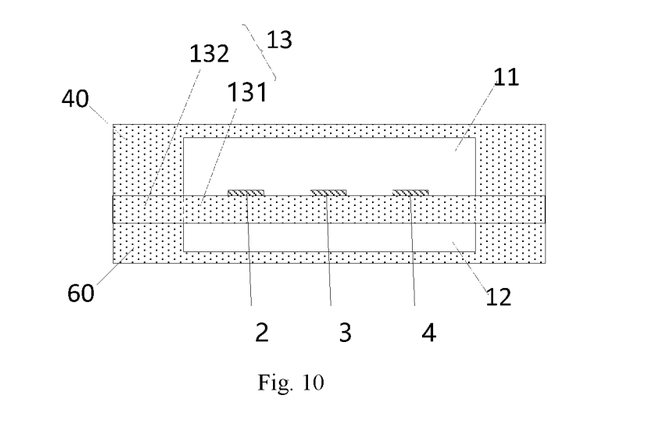
FIG. 10 is a sectional view of the flexible MEMS switch along line C-C' in FIG. 4.

The mechanical finite element deformation simulation on the flexible MEMS switch shows that, when the flexible MEMS switch in the related art is deformed with a radius of curvature of 5 mm, the distance between the second electrode 3 and the fourth electrode 5 changes from 1.75 μm to 0.86 μm, with a change of more than 50%, as shown in FIG. 10. In the embodiments of the present disclosure, when the flexible MEMS switch with strain isolation is deformed with a radius of curvature of 5 mm, and a height of a membrane bridge changes from 1.75 μm to 1.70 μm, with a change of less than 3%, as shown in FIG. 12. Hence, it is able to achieve an ideal strain isolation effect.

In the embodiments of the present disclosure, the MEMS body is located at a neutral layer of the packaging body 1.

During the bending, an outer layer is stretched and an inner layer is extruded. There inevitably exists a transition layer which is neither stretched nor extruded, and a stress applied to the transition layer is almost equal to zero. The transition layer is the neutral layer. In the embodiments of the present disclosure, the MEMS body is located at the neutral layer of the flexible base substrate 1, and when the flexible MEMS switch is deformed, no tensile deformation is generated in the MEMS body. The MEMS body is suspended in the packaging body 1, so the MEMS body may not be stretched or compressed when the whole flexible MEMS switch is deformed. As a result, it is able to prevent the performance of the flexible MEMS switch, e.g., a driving response characteristic, from being adversely affected by the deformation.

No tensile or compressive strain is generated at the MEMS body arranged at the neutral layer of the packaging body 1. When the first cavity 11 is formed between the first flexible cover plate 40 and the MEMS body and the second cavity 12 is formed between the second flexible cover plate 60 and the MEMS body, the MEMS body is not adversely affected by the deformation of the flexible MEMS switch. Through a strain isolation structure with the neutral layer and the cavities (i.e., the first cavity 11 and the second cavity 12), it is able for the MEMS body to maintain its structural shape when the flexible MEMS switch is deformed, thereby to prevent the performance of the flexible MEMS switch, e.g., the driving response characteristic, from being adversely affected by the deformation.

Figure 6:
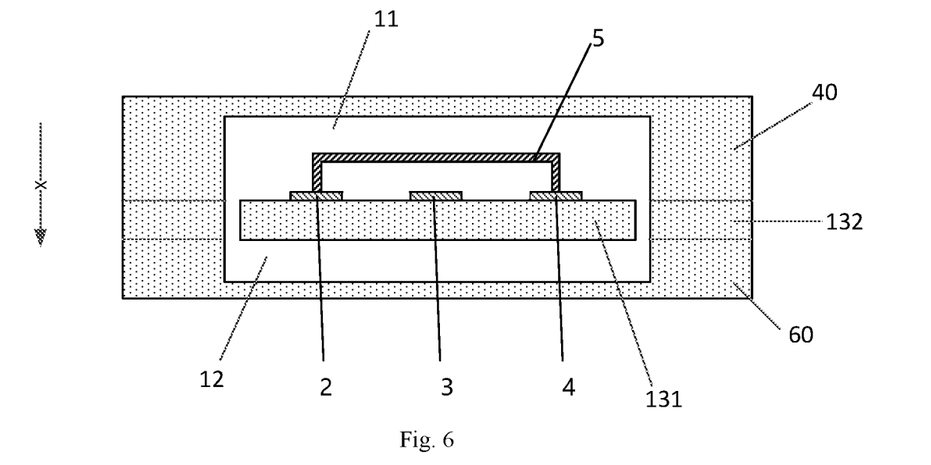
FIG. 6 is a sectional view of the flexible MEMS switch along line A-A' in FIG. 5.
Figure 7:
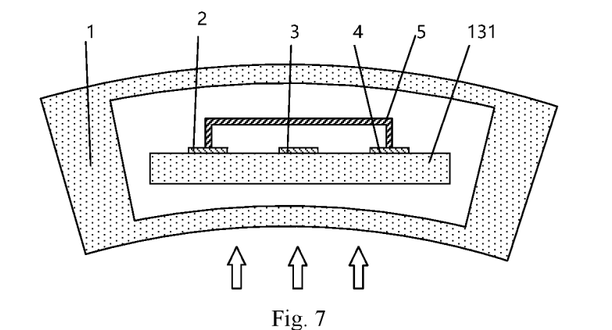
FIG. 7 is a schematic view showing a bending state of the flexible MEMS switch according to one embodiment of the present disclosure.
Figure 8:
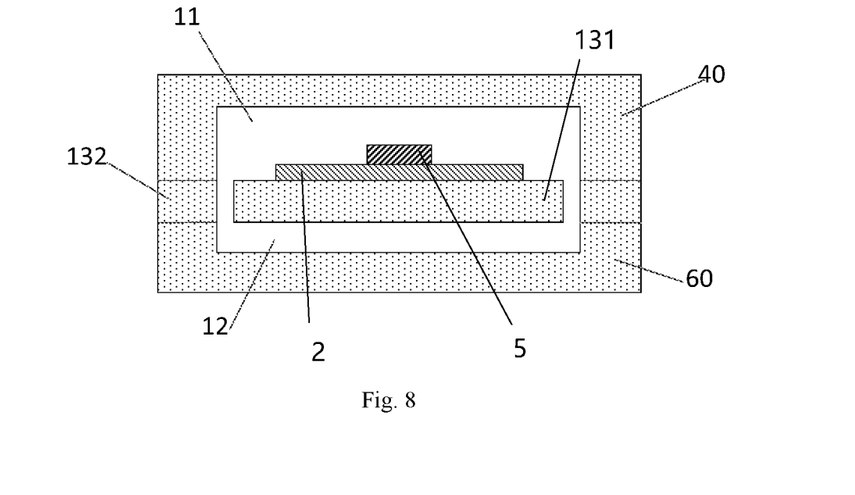
FIG. 8 is a sectional view of the flexible MEMS switch along line B-B' in FIG. 5.
Figure 9:
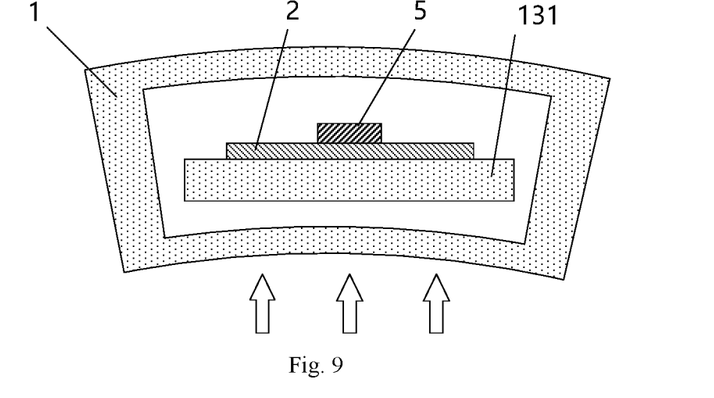
FIG. 9 is another schematic view showing the bending state of the flexible MEMS switch according to one embodiment of the present disclosure.

It should be appreciated that, in the embodiments of the present disclosure, the MEMS body includes a flexible base substrate 13 and a functional element on the flexible base substrate 13, the functional element is located in the first cavity 11, a gap is formed between the functional element of the MEMS body and the bottom of the first flexible cover plate 40, and a gap is formed between the flexible base substrate 13 of the MEMS body and the bottom of the second flexible cover plate 60. In other words, in a first direction (direction X in FIG. 6) from the first flexible cover plate 40 to the second flexible cover plate 60, the MEMS body is suspended in the packaging body 1, so as to reduce the influence on the MEMS body when the flexible MEMS switch is deformed.

In the embodiments of the present disclosure, the MEMS body includes the flexible base substrate 13 and the functional element on the flexible base substrate, the flexible base substrate 13 includes a first portion 131 where the functional element is arranged and a second portion 132 surrounding the first portion 131, the second portion 132 is of an annular shape and coupled to the packaging body, the first portion 131 includes a plurality of side walls facing the second portion 132, the plurality of side walls includes at least a first side wall, and a part of the first side wall in an extension direction of the first side wall is depressed in a direction away from the second portion 132 to form a gap between the first side wall and the second portion 132.

The packaging body 1 is coupled to the second portion 132, i.e., an end surface of the side wall of the first flexible cover plate 40 is coupled to one side of the second portion 132, an end surface of the side wall of the second flexible cover plate 60 is coupled to the other side of the second portion 132, and a part of the first side wall in an extension direction of the first side wall is depressed in a direction away from the second portion to form a notch. As a result, it is able to reduce a contact area between the first portion 131 and the second portion 132, thereby to reduce a stress transferred from the packaging body 1 to the MEMS body when the flexible MEMS switch is deformed.

It should be appreciated that, in the embodiments of the present disclosure, a middle part of the first side wall in an extension direction of the first side wall is depressed in a direction away from the second portion 132 to form a notch.

The quantity of the side walls where the notches are formed may be set according to the practical need. In order to improve uniformity of the stress, in a possible embodiment of the present disclosure, the plurality of side walls includes the first side wall and the second side wall arranged symmetrically opposite to the first side wall, i.e., a part of the first side wall in an extension direction of the first side wall is depressed in a direction away from the second portion 132 to form a notch, and a part of the second side wall in an extension direction of the first side wall is depressed in a direction away from the second portion 132 to form a notch.

In the embodiments of the present disclosure, the MEMS body includes the flexible base substrate 13 and the functional element on the flexible base substrate 13, the flexible base substrate 13 includes a first portion 131 where the functional element is arranged and a second portion 132 surrounding the first portion 131, the second portion 132 is of an annular shape and coupled to the packaging body 1, the first portion 131 includes a plurality of side walls facing the second portion 132, the plurality of side walls includes a first side wall 61 and a second side wall 62 arranged opposite to each other, a gap is formed between the first side wall 61 and the second portion 132, and a gap is formed between the second side wall 62 and the second portion 132.

Figure 4:
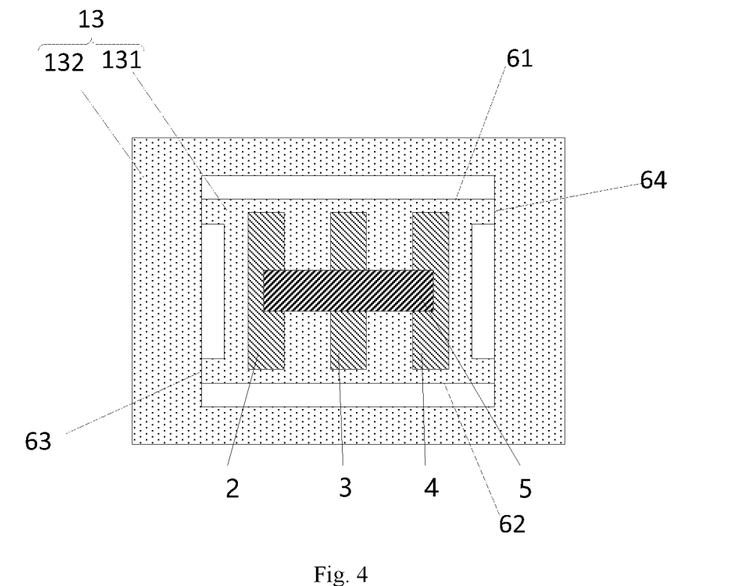
FIG. 4 is a schematic view showing an MEMS body according to one embodiment of the present disclosure.
Figure 5:
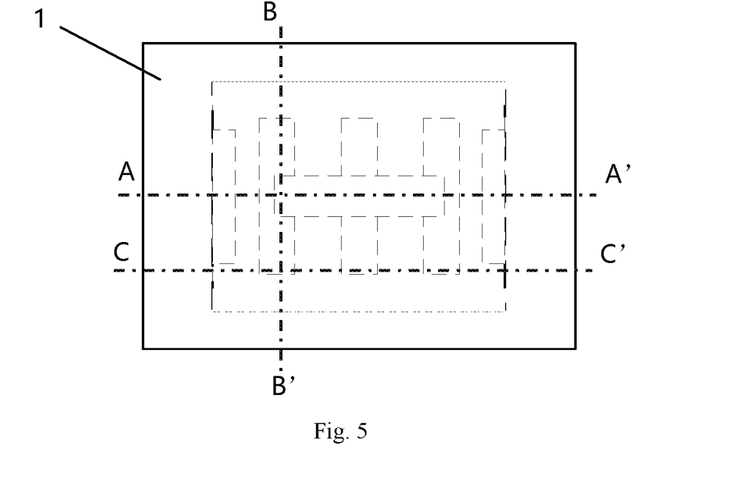
FIG. 5 is a schematic view showing a flexible MEMS switch according to one embodiment of the present disclosure.

When the gap is formed between the first side wall 61 and the second portion 132 and the gap is formed between the second side wall 62 and the second portion 132, as shown in FIG. 4, it is able to reduce the stress applied to the first portion 131 effectively.

In the embodiments of the present disclosure, the plurality of side walls includes the first side wall 61 and the second side wall 62 arranged opposite to each other, and a third side wall 63 and a fourth side wall 64 arranged symmetrically opposite to each other. A part of the first side wall 61 in an extension direction of the first side wall 61 is depressed in a direction away from the second portion 132 to form a notch.

It should be appreciated that, the gap is arranged between the first side wall 61 and the second portion 132, and the gap is arranged between the second side wall 62 and the second portion 132. At this time, the first portion 131 is coupled to the second portion 132 through the remaining two opposite side walls (the third side wall 63 and the fourth side wall 64) of the first portion 131. The third side wall 63 and the fourth side wall 64 may be coupled to the second portion 132 entirely or topically. As shown in FIG. 4, the first portion 131 is of an I-shaped structure, and both the third side wall 63 and the fourth side wall 64 are provided with notches so as to further reduce the contact area between the first portion 131 and the second portion 132, thereby to reduce the stress applied to the first portion 131.

In the embodiments of the present disclosure, the notch in the third side wall 63 is located in the middle of the third side wall 63 in its extension direction, and the notch in the fourth side wall 64 is located in the middle of the fourth wall 64 in its extension direction.

In the embodiments of the present disclosure, the functional element includes a first electrode 2, a second electrode 3 and a third electrode 4 arranged side-by-side and spaced apart from each other on the first portion 131, the second electrode 3 is a signal transmission line, both the first electrode 2 and the third electrode 4 are grounded lines, the MEMS body further includes a fourth electrode 5 arranged at a side of the second electrode 3 away from the flexible base substrate, and two ends of the fourth electrode 5 are coupled to the first electrode 2 and the third electrode 4 respectively.

In the embodiments of the present disclosure, an insulation layer 31 is arranged at a side of the second electrode 3 away from the flexible base substrate 13.

The present disclosure further provides in some embodiments a method for manufacturing the above-mentioned MEMS switch, including forming the MEMS body, the first flexible cover plate 40 and the second flexible cover plate 60, and enabling the first flexible cover plate 40 and the second flexible cover plate 60 to be coupled to the MEMS body at two opposite sides respectively.

Figure 13:
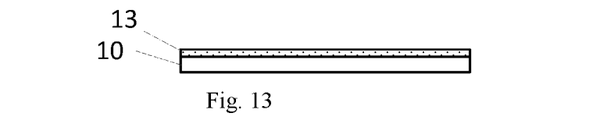
FIG. 13 is a schematic view showing the formation of a flexible substrate on a rigid substrate according to one embodiment of the present disclosure.
Figure 14:
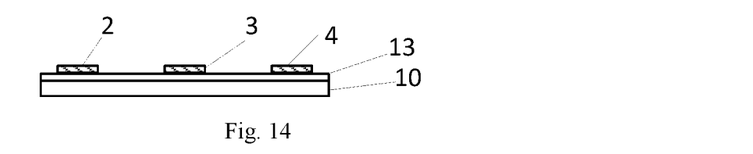
FIG. 14 is a schematic view showing the formation of a first electrode, a second electrode and a third electrode on the flexible substrate according to one embodiment of the present disclosure.
Figure 15:
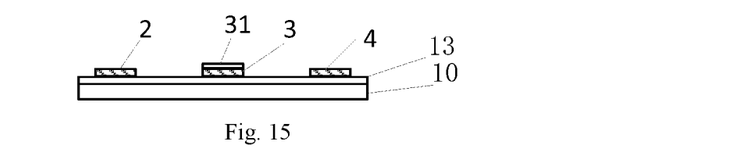
FIG. 15 is a schematic view showing the formation of an insulation layer on the second electrode according to one embodiment of the present disclosure.
Figure 16:
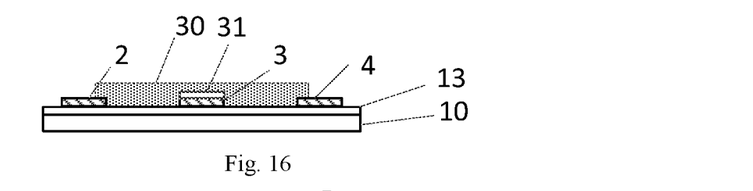
FIG. 16 is a schematic view showing the formation of a sacrificial layer according to one embodiment of the present disclosure.
Figure 17:
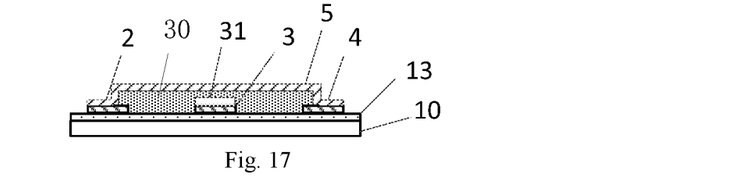
FIG. 17 is a schematic view showing the formation of a fourth electrode according to one embodiment of the present disclosure.
Figure 18:
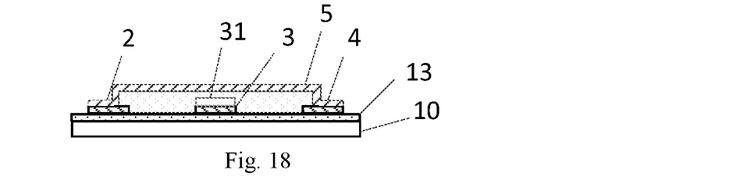
FIG. 18 is a schematic view showing the removal of the sacrificial layer to form the MEMS body according to one embodiment of the present disclosure.

In the embodiments of the present disclosure, the forming the MEMS body includes: forming a flexible base substrate on a rigid substrate, as shown in FIG. 13; depositing metal on the flexible base substrate to form a first electrode 2, a second electrode 3 and a third electrode 4 arranged side-by-side and spaced apart from each other, as shown in FIG. 14; forming an insulation layer on the second electrode 3, as shown in FIG. 15; forming a sacrificial layer 30 on the insulation layer, as shown in FIG. 16; forming a fourth electrode 5 on the sacrificial layer 30, two ends of the fourth electrode 5 being coupled to the first electrode 2 and the third electrode 4 respectively, as shown in FIG. 17; and removing the sacrificial layer 30, as shown in FIG. 18.

Figure 19:
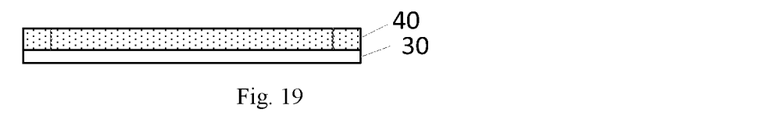
FIG. 19 is a schematic view showing the formation of a first flexible cover plate on the rigid substrate according to one embodiment of the present disclosure.

In the embodiments of the present disclosure, the first flexible cover plate 40 is formed through a same process as the second flexible cover plate 60, and the forming the first flexible cover plate 40 includes coating a flexible material on the rigid substrate, and forming the first flexible cover plate 40 through a photolithography process, as shown in FIG. 19.

Figure 20:
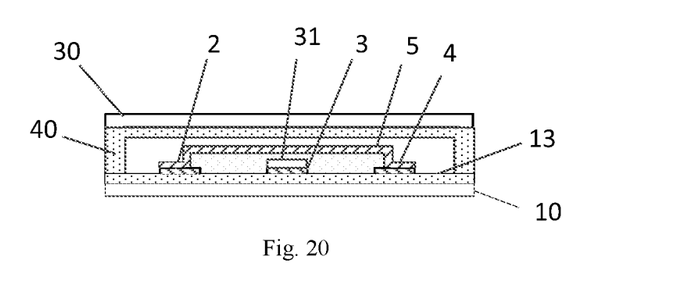
FIG. 20 is a schematic view showing the attachment of the first flexible cover plate to the MEMS body according to one embodiment of the present disclosure.
Figure 21:
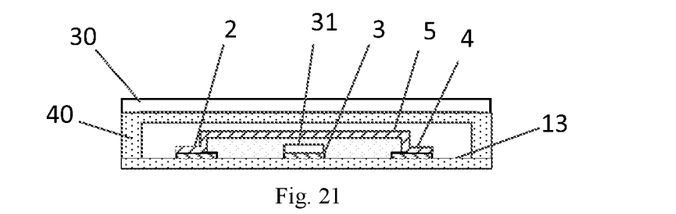
FIG. 21 is a schematic view showing the removal of the rigid substrate coupled to the MEMS body according to one embodiment of the present disclosure.
Figure 22:
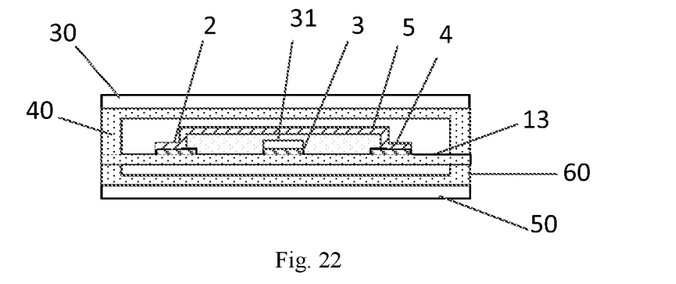
FIG. 22 is a schematic view showing the attachment of a second flexible cover plate to the MEMS body according to one embodiment of the present disclosure.
Figure 23:
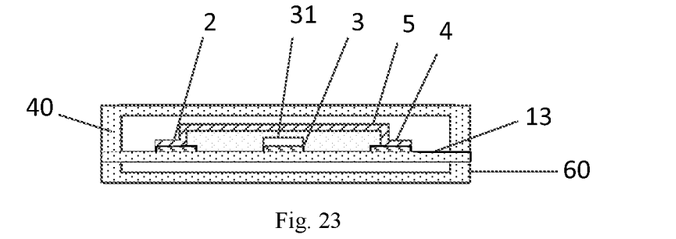
FIG. 23 is a schematic view showing the removal of the rigid substrate coupled to the first flexible cover plate and the removal of the rigid substrate coupled to the second flexible cover plate according to one embodiment of the present disclosure.

In the embodiments of the present disclosure, the enabling the first flexible cover plate 40 and the second flexible cover plate 60 to be coupled to the MEMS body at two opposite sides respectively includes: fastening the rigid substrate with the first flexible cover plate 40 onto the rigid substrate on which the MEMS body is formed, and enabling an end surface of a side wall of the first flexible cover plate to be coupled to the second portion 132 of the flexible base substrate 13, as shown in FIG. 20; removing the rigid substrate coupled to the MEMS body through a laser lift-off process, as shown in FIG. 21; fastening the rigid substrate with the second flexible cover plate 60 onto a side of the MEMS body opposite to the first flexible cover plate 40, and enabling an end surface of a side wall of the second flexible cover plate 60 to be coupled to the second portion 132 of the flexible base substrate 13, as shown in FIG. 22; and removing the rigid substrate coupled to the first flexible cover plate 40 and the rigid substrate coupled to the second flexible cover plate 60 through a laser lift-off process, as shown in FIG. 23.

It should be appreciated that, FIG. 19 to FIG. 23 are sectional views.

It should be appreciated that, the above embodiments are for illustrative purposes only, but the present disclosure is not limited thereto. A person skilled in the art may make further modifications and improvements without departing from the spirit of the present disclosure, and these modifications and improvements shall also fall within the scope of the present disclosure.

What is claimed is:

1. A flexible Micro-Electro-Mechanical System (MEMS) switch, comprising an MEMS body and a packaging body outside the MEMS body, wherein the packaging body comprises a first flexible cover plate and a second flexible cover plate, the first flexible cover plate and the second flexible cover plate are arranged at opposite sides of the MEMS body respectively, a first cavity is formed between the first flexible cover plate and the MEMS body, and a second cavity is formed between the second flexible cover plate and the MEMS body;

wherein the MEMS body comprises a flexible base substrate and a functional element on the flexible base substrate, the flexible base substrate comprises a first portion where the functional element is arranged and a second portion surrounding the first portion, the second portion is of an annular shape and coupled to the packaging body, the first portion comprises a plurality of side walls facing the second portion, the plurality of side walls comprises at least a first side wall, and a part of the first side wall in an extension direction of the first side wall is depressed in a direction away from the second portion to form a gap between the first side wall and the second portion.

2. The MEMS switch according to claim 1, wherein the MEMS body is located at a neutral layer of the packaging body.

3. The MEMS switch according to claim 1, wherein the plurality of side walls comprises the first side wall and a second side wall arranged symmetrically opposite to the first side wall.

4. The MEMS switch according to claim 1, the plurality of side walls comprises a second side wall arranged opposite to the first side wall, a gap is formed between the second side wall and the second portion.

5. The MEMS switch according to claim 4, wherein the plurality of side walls comprises a third side wall and a fourth side wall arranged symmetrically opposite to the third side wall.

6. The MEMS switch according to claim 1, wherein the functional element comprises a first electrode, a second electrode and a third electrode arranged side-by-side and spaced apart from each other on the first portion, the second electrode is a signal transmission line, both the first electrode and the third electrode are grounded lines, the MEMS body further comprises a fourth electrode arranged at a side of the second electrode away from the flexible base substrate, and two ends of the fourth electrode are coupled to the first electrode and the third electrode respectively.

7. The MEMS switch according to claim 6, wherein an insulation layer is arranged at a side of the second electrode away from the flexible base substrate.

8. A method for manufacturing the MEMS switch according to claim 1, comprising forming an MEMS body, a first flexible cover plate and a second flexible cover plate, and enabling the first flexible cover plate and the second flexible cover plate to be coupled to the MEMS body at two opposite sides respectively.

9. The method according to claim 8, wherein the forming the MEMS body comprises:

forming a flexible substrate on a rigid substrate;
depositing metal on the flexible substrate to form a first electrode, a second electrode and a third electrode arranged side-by-side and spaced apart from each other;
forming an insulation layer on the second electrode;
forming a sacrificial layer on the insulation layer;
forming a fourth electrode on the sacrificial layer, two ends of the fourth electrode being coupled to the first electrode and the third electrode respectively; and
removing the sacrificial layer.

10. The method according to claim 9, wherein the first flexible cover plate is formed through a same process as the second flexible cover plate, and the forming the first flexible cover plate comprises coating a flexible material on the rigid substrate and forming the first flexible cover plate through a photolithography process.

11. The method according to claim 10, wherein the MEMS body comprises a flexible base substrate and a functional element on the flexible base substrate, and the flexible base substrate comprises a first portion where the functional element is arranged and a second portion surrounding the first portion, wherein the enabling the first flexible cover plate and the second flexible cover plate to be coupled to the MEMS body at two opposite sides respectively comprises:
fastening the rigid substrate with the first flexible cover plate onto a first side of the MEMS body, and enabling an end surface of a side wall of the first flexible cover plate to be coupled to the second portion of the flexible base substrate;
removing the rigid substrate coupled to the MEMS body through a laser lift-off process;
fastening the rigid substrate with the second flexible cover plate onto a second side of the MEMS body opposite to the first side, and enabling an end surface of a side wall of the second flexible cover plate to be coupled to the second portion of the flexible base substrate; and
removing the rigid substrate coupled to the first flexible cover plate and the rigid substrate coupled to the second flexible cover plate through a laser lift-off process.

12. The MEMS switch according to claim 4, wherein the functional element comprises a first electrode, a second electrode and a third electrode arranged side-by-side and spaced apart from each other on the first portion, the second electrode is a signal transmission line, both the first electrode and the third electrode are grounded lines, the MEMS body further comprises a fourth electrode arranged at a side of the second electrode away from the flexible base substrate, and two ends of the fourth electrode are coupled to the first electrode and the third electrode respectively.

* * * * *